(12) United States Patent
Ohsawa et al.

(10) Patent No.: US 8,208,225 B2
(45) Date of Patent: *Jun. 26, 2012

(54) SUSPENSION BOARD WITH CIRCUIT AND PRODUCING METHOD THEREOF

(75) Inventors: Tetsuya Ohsawa, Osaka (JP); Toshiki Naito, Osaka (JP)

(73) Assignee: Nitto Denko Corporation, Osaka (JP)

( * ) Notice: Subject to any disclaimer, the term of this patent is extended or adjusted under 35 U.S.C. 154(b) by 382 days.

This patent is subject to a terminal disclaimer.

(21) Appl. No.: 12/588,906

(22) Filed: Nov. 2, 2009

(65) Prior Publication Data

US 2010/0118443 A1 May 13, 2010

Related U.S. Application Data

(60) Provisional application No. 61/193,381, filed on Nov. 21, 2008.

(30) Foreign Application Priority Data

Nov. 11, 2008 (JP) .................................. 2008-289047

(51) Int. Cl.
G11B 5/48 (2006.01)
(52) U.S. Cl. .................................................. 360/245.9
(58) Field of Classification Search .................. None
See application file for complete search history.

(56) References Cited

U.S. PATENT DOCUMENTS

| | | | |
|---|---|---|---|
| 6,110,330 A | 8/2000 | Lin et al. | |
| 6,139,936 A | 10/2000 | Weiss | |
| 6,166,888 A | 12/2000 | Tsuda et al. | |
| 6,400,529 B1 | 6/2002 | Baba et al. | |
| 6,459,548 B1 | 10/2002 | Shiraishi et al. | |
| 2003/0107843 A1 | 6/2003 | Hanya et al. | |
| 2003/0227718 A1 | 12/2003 | Ishikawa | |
| 2004/0089638 A1 | 5/2004 | Tanaka | |
| 2005/0045601 A1 | 3/2005 | Kashima et al. | |
| 2006/0039084 A1 | 2/2006 | Kashima | |
| 2006/0187564 A1 | 8/2006 | Sato et al. | |
| 2006/0266471 A1 | 11/2006 | Tanaka | |
| 2007/0177302 A1 | 8/2007 | Shimazawa et al. | |
| 2007/0242921 A1 | 10/2007 | Matsumoto | |
| 2007/0247760 A1 | 10/2007 | Hanya et al. | |
| 2008/0115962 A1 | 5/2008 | Juni et al. | |
| 2008/0130155 A1 | 6/2008 | Naniwa et al. | |

(Continued)

FOREIGN PATENT DOCUMENTS

JP 07-078436 3/1995

(Continued)

*Primary Examiner* — Allen Cao
(74) *Attorney, Agent, or Firm* — Jean C. Edwards, Esq.; Edwards Neils PLLC

(57) ABSTRACT

A suspension board with circuit includes a conductive pattern, a board main body portion on which a magnetic head is mounted, and an auxiliary portion capable of being folded back with respect to the board main body portion so as to face a back surface of the board main body portion. The conductive pattern includes a first conductive pattern including a first terminal electrically connected to an external circuit, and a second terminal electrically connected to the magnetic head, and a second conductive pattern including a third terminal electrically connected to the external circuit, and a fourth terminal electrically connected to an electronic element. Both of the first terminal and the second terminal are disposed on the board main body portion. The third terminal is disposed on the board main body portion or on the auxiliary portion, and the fourth terminal is disposed on the auxiliary portion.

4 Claims, 9 Drawing Sheets

U.S. PATENT DOCUMENTS

| | | | |
|---|---|---|---|
| 2010/0118445 A1* | 5/2010 | Ohsawa et al. | 360/246.2 |
| 2010/0188779 A1* | 7/2010 | Ohsawa et al. | 360/246.1 |

FOREIGN PATENT DOCUMENTS

| | | |
|---|---|---|
| JP | 10-241133 | 9/1998 |
| JP | 10-293915 | 11/1998 |
| JP | 2000-348451 A | 12/2000 |
| JP | 2001-023138 A | 1/2001 |
| JP | 2002-216327 A | 8/2002 |
| JP | 2003-045004 A | 2/2003 |
| JP | 2003-173643 | 6/2003 |
| JP | 2004-154836 | 6/2004 |
| JP | 2005-71465 | 3/2005 |
| JP | 2006-59464 | 3/2006 |
| JP | 2006-185548 A | 7/2006 |
| JP | 2007-052918 A | 3/2007 |
| JP | 2007-157209 A | 6/2007 |
| JP | 2007-207349 A | 8/2007 |
| JP | 2007-280572 A | 10/2007 |
| JP | 2007-287296 A | 11/2007 |
| JP | 2008-34091 | 2/2008 |
| JP | 2008-130106 A | 6/2008 |
| JP | 2008-152899 A | 7/2008 |
| WO | WO 02/050835 A1 | 6/2002 |

* cited by examiner (a)

(b)

SUSPENSION BOARD WITH CIRCUIT AND PRODUCING METHOD THEREOF

CROSS-REFERENCE TO RELATED APPLICATION

This patent application claims the benefit of U.S. Provisional Application No. 61/193,381, filed on Nov. 21, 2008, and claims priority from Japanese Patent Application No. 2008-289047, filed on Nov. 11, 2008, the contents of which are herein incorporated by reference in their entirety.

BACKGROUND OF THE INVENTION

1. Field of the Invention

The present invention relates to a suspension board with circuit and a producing method thereof and, more particularly, to a suspension board with circuit used in a hard disk drive and a producing method thereof.

2. Description of the Related Art

Conventionally, it has been widely known that a suspension board with circuit is used in a hard disk drive. Such a suspension board with circuit includes a suspension, and a conductive pattern formed thereon, and having a head-side terminal portion for connecting to a magnetic head. In the suspension board with circuit, the magnetic head is mounted on the suspension, and connected to the head-side terminal portion.

In recent years, in an attempt to accurately and finely adjust the position and angle of the magnetic head, it has been proposed that a microactuator is disposed on the suspension (on the surface thereof) and around the magnetic head (see, e.g., Japanese Unexamined Patent No. 2008-34091). The microactuator proposed in Japanese Unexamined Patent No. 2008-34091 is connected to a terminal portion (actuator-side terminal portion) of suspension traces formed on the suspension to be supplied with current from the suspension traces.

SUMMARY OF THE INVENTION

However, in Japanese Unexamined Patent No. 2008-34091, both of the magnetic head and the microactuator are mounted on the surface of the single suspension. Accordingly, the head-side terminal portion and the actuator-side terminal portion should be arranged at a high density, leading to a problem that a short circuit easily occurs therebetween.

When the short circuit is to be prevented, it is necessary to ensure a large space for the disposition of the head-side terminal portion and the actuator-side terminal portion. However, this results in a problem that a suspension board with circuit cannot be compactly mounted in the hard disk drive.

It is therefore an object of the present invention to provide a suspension board with circuit which can be compactized, and has high connection reliability, while allowing individual types of terminals to be arranged at low densities.

A suspension board with circuit of the present invention is a suspension board with circuit including a conductive pattern, a board main body portion having a surface on which a magnetic head is mounted, and an auxiliary portion formed continuously from the board main body portion, and capable of being folded back with respect to the board main body portion so as to face a back surface of the board main body portion, wherein the conductive pattern includes a first conductive pattern including a first terminal electrically connected to an external circuit, and a second terminal electrically connected to the magnetic head, and a second conductive pattern including a third terminal electrically connected to the external circuit, and a fourth terminal electrically connected to an electronic element, wherein, in the first conductive pattern, both of the first terminal and the second terminal are disposed on the board main body portion, and, in the second conductive pattern, the third terminal is disposed on the board main body portion or on the auxiliary portion, and the fourth terminal is disposed on the auxiliary portion.

In the suspension board with circuit, it is preferable that the board main body portion has an opening formed to extend therethrough in a thickness direction, and the auxiliary portion includes an insertion portion to be inserted into the opening when the auxiliary portion is folded back.

In the suspension board with circuit, it is preferable that the board main body portion includes a slider mounting region where a slider for mounting thereon the magnetic head is mounted, the auxiliary portion includes an element mounting region where the electronic element is mounted, and the slider mounting region and the element mounting region are disposed to face each other in a thickness direction when the auxiliary portion is folded back.

In the suspension board with circuit of the present invention, each of the first terminal, the second terminal, and the third terminal is disposed on the board main body portion, while the fourth terminal is disposed on the auxiliary portion. Alternatively, both of the first terminal and the second terminal are disposed on the board main body portion, while both of the third terminal and the fourth terminal are disposed on the auxiliary portion.

That is, the fourth terminal is disposed on the auxiliary portion different from the board main body portion on which the first terminal, the second terminal, and the third terminal are disposed. Alternatively, the third terminal and the fourth terminal are disposed on the auxiliary portion different from the board main body portion on which the first terminal and the second terminal are disposed.

This allows the individual types of terminals to be formed at different low arrangement densities on the board main body portion and on the auxiliary portion. As a result, it is possible to prevent a short circuit therebetween, and consequently improve the connection reliability of the conductive pattern.

In addition, by folding back the auxiliary portion such that it faces the back surface of the board main body portion, it is possible to mount the electronic element on the auxiliary portion facing the back surface of the board main body portion, while allowing a magnetic head to be mounted on the surface of the board main body portion. This can achieve compactization of the suspension board with circuit.

A producing method of a suspension board with circuit of the present invention is a producing method of a suspension board with circuit including a conductive pattern, a board main body portion having a surface on which a magnetic head is mounted, and an auxiliary portion formed continuously from the board main body portion, and capable of being folded back with respect to the board main body portion so as to face a back surface of the board main body portion, wherein the conductive pattern includes a first conductive pattern including a first terminal electrically connected to an external circuit, and a second terminal electrically connected to the magnetic head, and a second conductive pattern including a third terminal electrically connected to the external circuit, and a fourth terminal electrically connected to an electronic element, wherein, in the first conductive pattern, both of the first terminal and the second terminal are disposed on the board main body portion, and, in the second conductive pattern, the third terminal is disposed on the board main body portion or on the auxiliary portion, and the fourth terminal is disposed on the auxiliary portion, the producing method of the suspension board with circuit including a folding-back step of folding back the auxiliary portion of the suspension board with circuit with respect to the board main body portion such that the auxiliary portion faces the back surface of the board main body portion, and a step of, after the folding-back step, joining together the metal supporting board of the board main body portion and the metal supporting board of the auxiliary portion which are adjacent to each other in a thickness direction by welding.

In accordance with the producing method of the suspension board with circuit, it is possible to reliably maintain the folded-back state of the auxiliary portion by a simple and easy method of folding back the auxiliary portion, and then joining together the auxiliary portion and the board main body portion by welding.

DETAILED DESCRIPTION OF THE INVENTION

Figure 1:
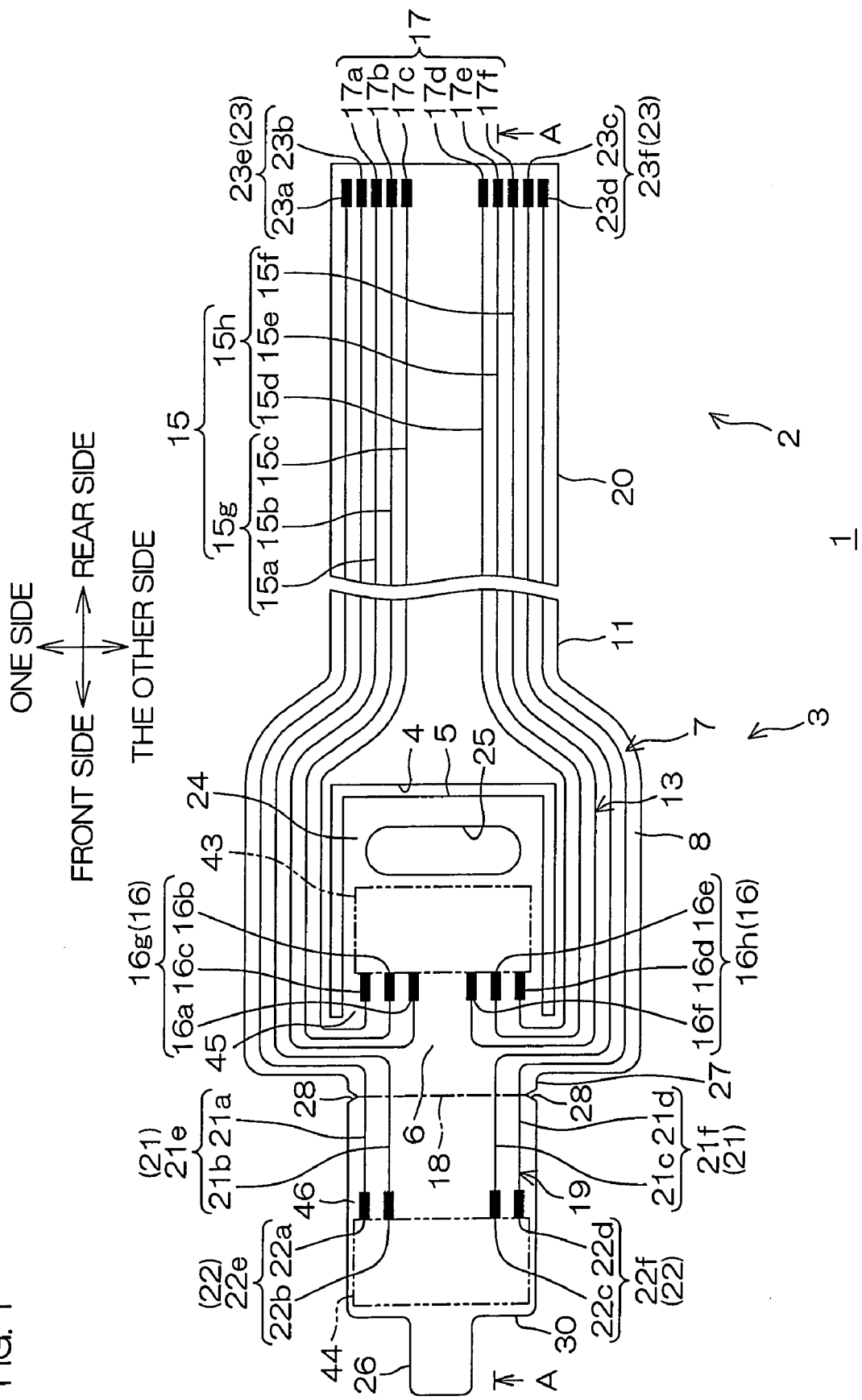
FIG. 1 is a plan view of a suspension board with circuit according to an embodiment of the present invention.
Figure 2:
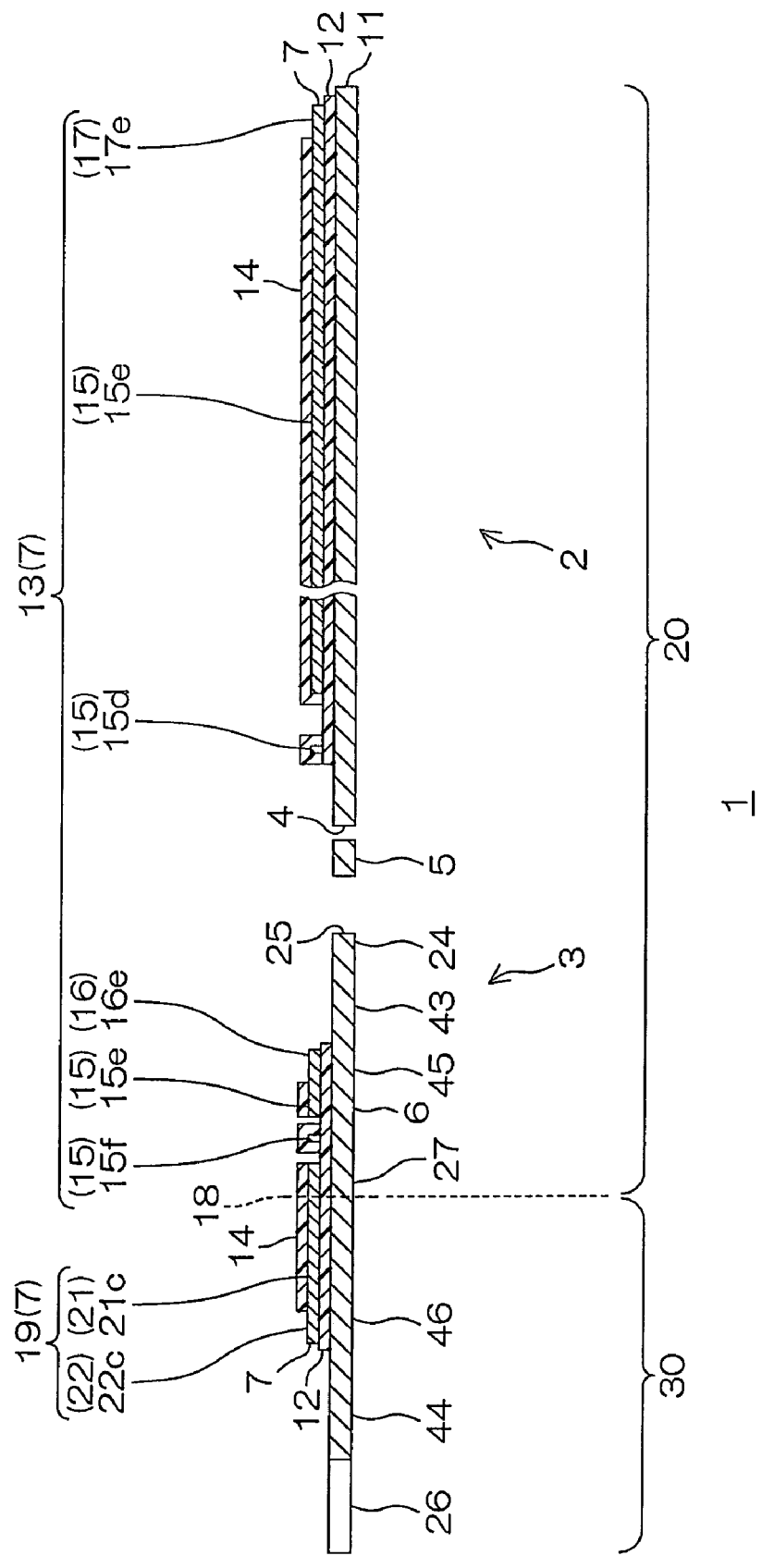
FIG. 2 is a cross-sectional view of the suspension board with circuit shown in FIG. 1 along the line A-A.
Figure 3:
FIG. 3 is a process view for illustrating a producing method of the suspension board with circuit shown in FIG. 2,
 (a) showing the step of preparing a metal supporting board,
 (b) showing the step of forming an insulating base layer,
 (c) showing the step of forming a conductive pattern,
 (d) showing the step of forming an insulating cover layer, and
 (e) showing the step of forming a slit portion and an opening.
Figure 3:
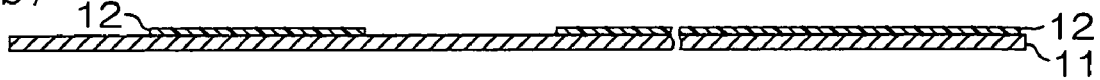
Figure 3:
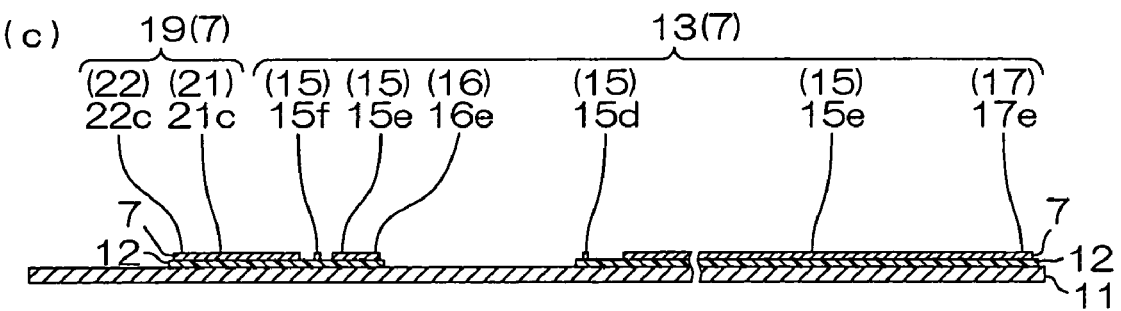
Figure 3:
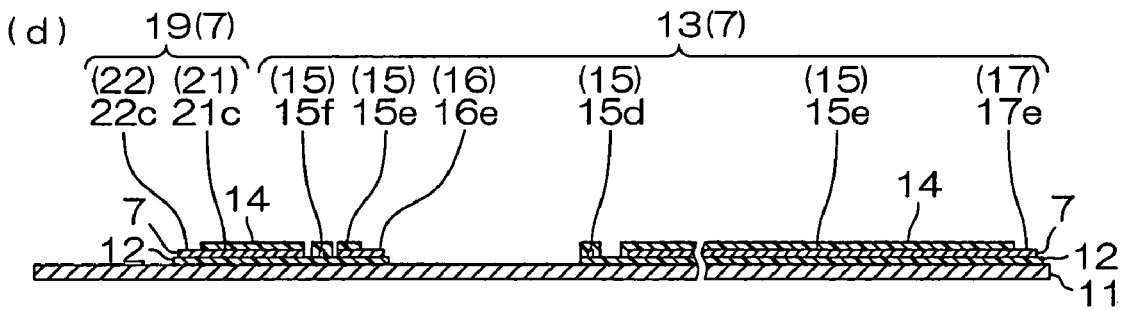
Figure 3:
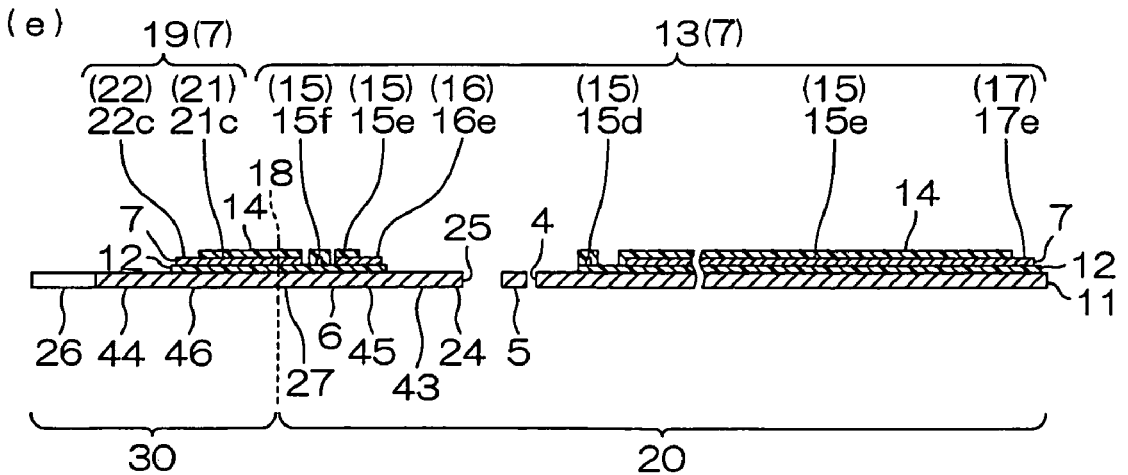

FIG. 1 is a plan view of a suspension board with circuit according to an embodiment of the present invention. FIG. 2 is a cross-sectional view of the suspension board with circuit shown in FIG. 1 along the line A-A. FIG. 3 is a process view for illustrating a producing method of the suspension board with circuit shown in FIG. 2. Each of FIGS. 4 to 6 shows a state where an auxiliary portion of the suspension board with circuit of FIG. 1 is folded back, in which FIG. 4 is a plan view thereof, FIG. 5 is a bottom view thereof, and FIG. 6 is a cross-sectional view thereof along the line B-B of FIG. 4.

Figure 4:
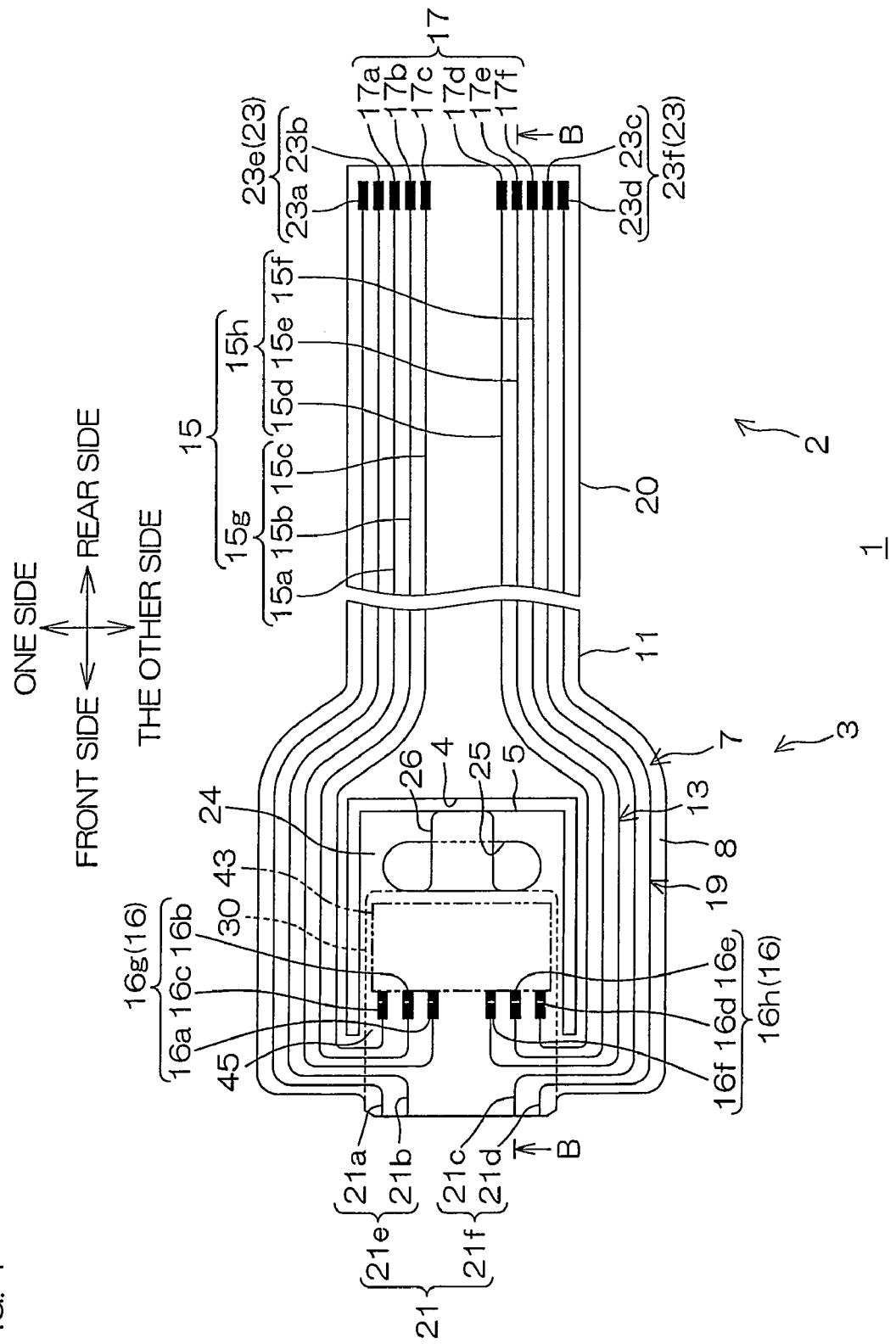
FIG. 4 is a plan view showing a state where an auxiliary portion of the suspension board with circuit of FIG. 1 is folded back.
Figure 5:
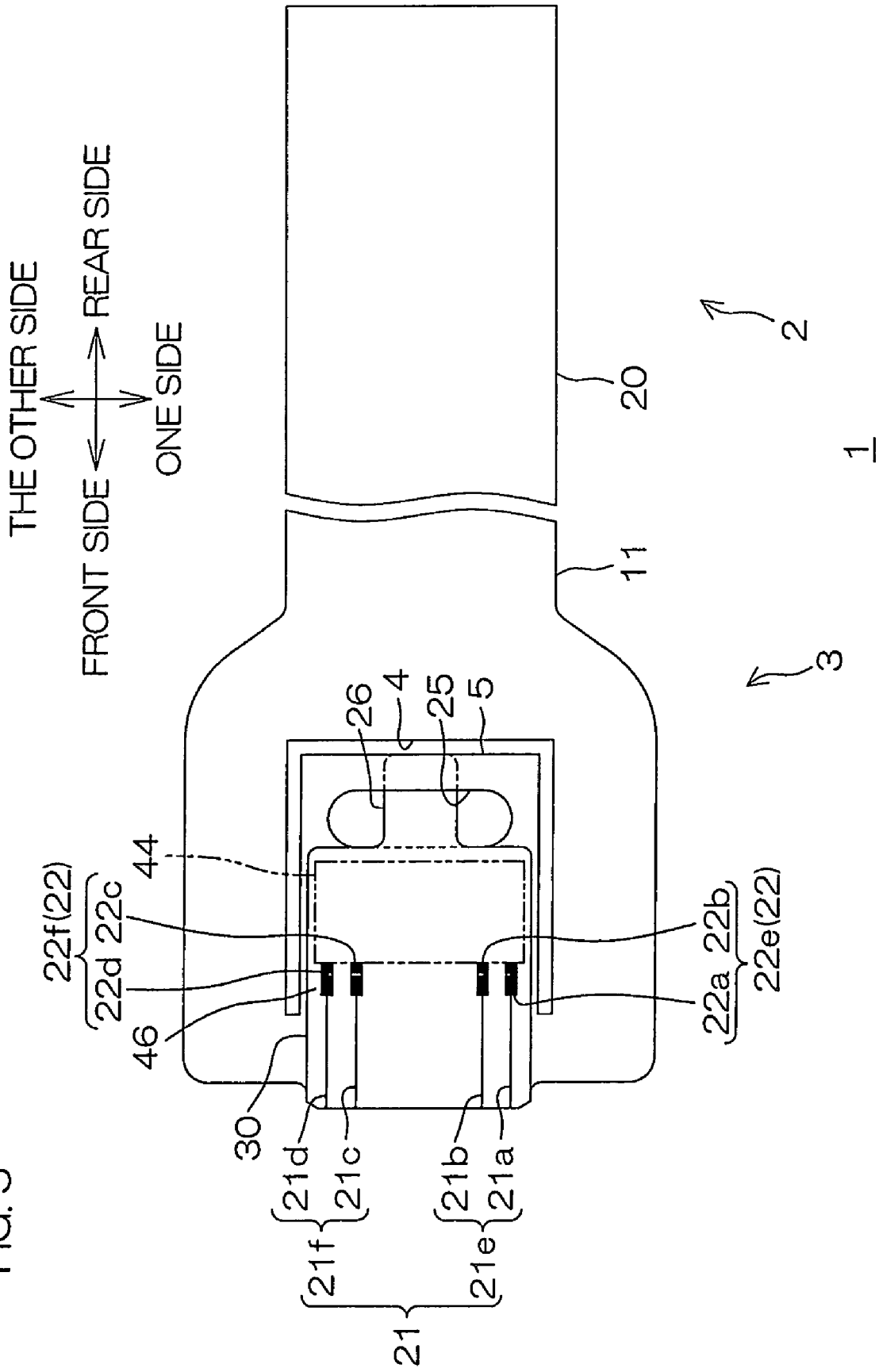
FIG. 5 is a bottom view of the suspension board with circuit of FIG. 4.
Figure 6:
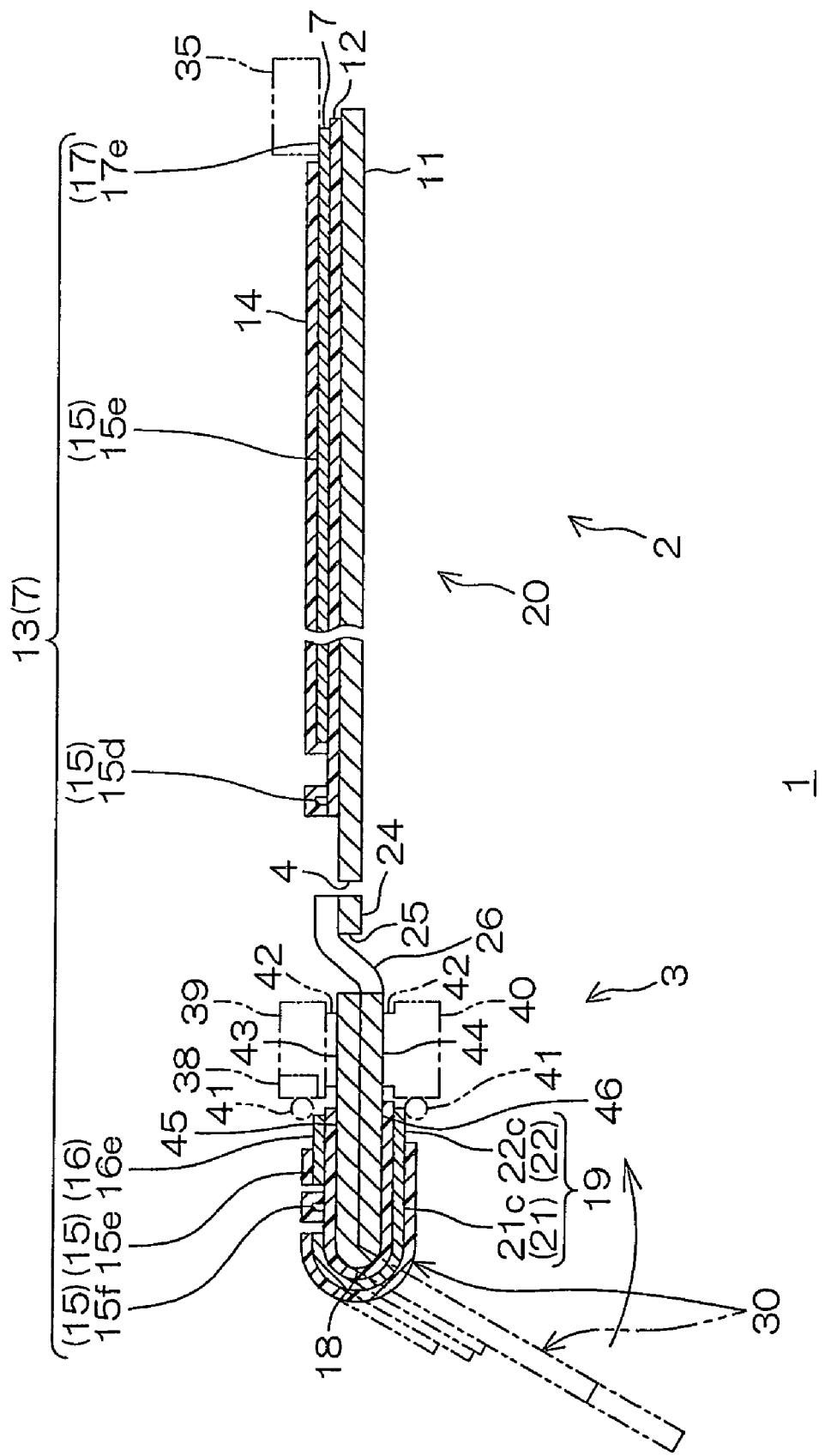
FIG. 6 is a cross-sectional view of the suspension board with circuit of FIG. 4 along the line B-B.

In FIGS. 1, 4, and 5, an insulating base layer 12 and an insulating cover layer 14, each described later, are omitted for clear illustration of relative positioning of a conductive pattern 7 described later.

In FIGS. 1 and 2, a suspension board with circuit 1 has an auxiliary portion 30 described later, which is folded back. As shown in FIG. 6, a slider 39 for mounting thereon a magnetic head 38 described later, and an electronic element 40 are mounted on the suspension board with circuit 1, and the suspension board with circuit 1 is used in a hard disk drive.

In the suspension board with circuit 1, the conductive pattern 7 is supported on a metal supporting board 11.

The metal supporting board 11 is formed in a flat belt shape extending in a longitudinal direction, and integrally includes a board main body portion 20, and the auxiliary portion 30.

The board main body portion 20 is formed in a flat belt shape extending in the longitudinal direction, and integrally includes a wiring portion 2 disposed on one longitudinal side (hereinafter referred to as a rear side), and a mounting portion 3 disposed on the other longitudinal side (hereinafter referred to as a front side) of the wiring portion 2.

The wiring portion 2 is formed in a generally rectangular plan view shape extending in the longitudinal direction. The wiring portion 2 is defined in the board main body portion 20 as a region which is mounted and supported with a back surface (lower surface) thereof facing downward on a load beam not shown.

The mounting portion 3 is defined in the board main body portion 20 as a region exposed from the load beam, together with the auxiliary portion 30 described next, without being mounted on the load beam when the wiring portion 2 is mounted on the load beam. Specifically, the mounting portion 3 is formed as the other longitudinal end portion (front end portion) of the board main body portion 20 on which a slider 39 (the magnetic head 38 mounted thereon) is mounted.

Specifically, the mounting portion 3 is formed continuously from the front end of the wiring portion 2 into a generally rectangular plan view shape which protrudes on both outsides of the wiring portion 2 in a widthwise direction (direction perpendicular to the longitudinal direction).

The mounting portion 3 has a slit portion 4 formed in a generally U-shaped shape which opens toward the front side when viewed in plan view. The mounting portion 3 is partitioned into a gimbal portion 5 widthwise interposed in the slit portion 4, outrigger portions 8 disposed on both outsides of the slit portion 4 in the widthwise direction, and a wire turnback portion 6 disposed on the front side of the gimbal portion 5 and the outrigger portion 8.

The gimbal portion 5 is for imparting flexibility to the operation of the slider 39 (see FIG. 6), disposed at the center of the mounting portion 3 in the both widthwise and front-to-rear directions, and formed in a generally rectangular plan view shape. The gimbal portion 5 is partitioned into a slider mounting region 43, a head-side-terminal formation portion 45, and an opening formation portion 24.

The slider mounting region 43 is for mounting the slider 39 (slider 39 for mounting thereon the magnetic head 38) on the surface (upper surface) thereof, disposed at the longitudinal center of the gimbal portion 5, and defined in a generally rectangular plan view shape elongated in the widthwise direction.

The head-side-terminal formation portion 45 is a region on the surface (upper surface) of which head-side terminals 16 are formed, and disposed on the front side of the slider mounting region 43. The head-side-terminal formation portion 45 is defined so as to extend in the widthwise direction.

The opening formation portion 24 is a region defined on the rear side of the slider mounting region 43, and has an opening 25 formed to extend through the metal supporting board 1 in a thickness direction thereof.

The opening 25 is formed in a long hole shape elongated in the widthwise direction. As shown in FIG. 6, when the auxiliary portion 30 described later is folded back, an insertion portion 26 is inserted into the opening 25.

The wire turn-back portion 6 is defined in a generally rectangular plan view shape elongated in the widthwise direction. On the front side of the wire turn-back portion 6, there is provided a protruding portion 27 which has the widthwise center portion thereof slightly protruding toward the front side.

The protruding portion 27 is formed in a generally rectangular plan view shape having a width slightly smaller than or equal to the width (widthwise length) of the gimbal portion 5, and defined as a region through which power source wires 21 described later pass.

The auxiliary portion 30 is formed continuously from the board main body portion 20. Specifically, the auxiliary portion 30 is formed to extend from the front end of the protruding portion 27 of the wire turn-back portion 6 toward the front side. More specifically, the auxiliary portion 30 is formed in a generally rectangular plan view shape having generally the same width as that of the protruding portion 27.

The auxiliary portion 30 is partitioned into an element mounting region 44 and an element-side-terminal formation portion 46.

The element mounting region 44 is for mounting the electronic element 40 (see the imaginary line of FIG. 6) on the surface (the upper surface, or the back surface (lower surface) when the auxiliary portion 30 described later is folded back), disposed in the front end portion of the auxiliary portion 30, and defined in a generally rectangular plan view shape.

The element mounting region 44 is disposed to face the slider mounting region 43 in spaced-apart relation in the longitudinal direction. As shown in FIG. 6, the element mounting region 44 is disposed to face the slider mounting region 43 in the thickness direction when the auxiliary portion 30 is folded back.

As shown in FIGS. 1 and 2, the element-side-terminal formation portion 46 is a region where element-side terminals 22 described later are formed on the surface (the upper side, or the back surface (lower surface) when the auxiliary portion 30 is folded back, as shown in FIG. 6), and defined on the rear side of the element mounting region 44 in the auxiliary portion 30.

The element-side-terminal formation portion 46 is disposed to face the head-side-terminal formation portion 45 in spaced-apart relation in the longitudinal direction. As shown in FIG. 6, the element-side-terminal formation portion 46 is disposed to face the head-side-terminal formation portion 45 in the thickness direction when the auxiliary portion 30 is folded back.

On the front side of the auxiliary portion 30, there is provided the insertion portion 26.

The insertion portion 26 is formed so as to protrude from the widthwise center of the front end portion of the auxiliary portion 30 toward the front side. The insertion portion 26 is formed in a generally rectangular plan view shape having a width smaller than or equal to the width of the opening 25 mentioned above. As shown in FIG. 6, the insertion portion 26 is inserted into the opening 25 when the auxiliary portion 30 is folded back.

In the suspension board with circuit 1, as shown in FIG. 1, a fold portion 18 indicated by the imaginary line is provided on the boundary between the protruding portion 27 of the board main body portion 20 and the auxiliary portion 30.

The fold portion 18 is formed in a linear shape extending along the widthwise direction, and has notched portions 28 formed in the both widthwise end portions thereof. The notched portions 28 are formed by notching, in a widthwise inward direction, the respective both widthwise end portions of the board main body portion 20 and the auxiliary portion 30 into generally triangular plan view shapes.

In this manner, the fold portion 18 is formed as a fragile portion between the board main body portion 20 (protruding portion 27) and the auxiliary portion 30. Therefore, the auxiliary portion 30 can be folded back with respect to the board main body portion 20 such that the surface (back surface) of the fold portion 18 forms a mountain (valley) portion.

The notched portions 28 having the shapes described above can clearly show the position of the fold portion 18, and hence it is possible to easily and reliably perform a folding back step (described later).

As shown in FIGS. 1 and 2, the conductive pattern 7 includes a first conductive pattern 13, and a second conductive pattern 19.

The first conductive pattern 13 is formed on the surface of the metal supporting board 1, and integrally includes external terminals 17 each as a first terminal, the head-side terminals 16 each as a second terminal, and signal wires 15 for connecting the external terminals 17 and the head-side terminals 15.

The plurality of (six) signal wires 15 are provided over the board main body portion 20 along the longitudinal direction, and arranged in parallel to be spaced apart from each other in the widthwise direction.

The plurality of signal wires 15 are formed of a first signal wire 15a, a second signal wire 15b, a third signal wire 15c, a fourth signal wire 15d, a fifth signal wire 15e, and a sixth signal wire 15f. The first signal wire 15a, the second signal wire 15b, the third signal wire 15c, the fourth signal wire 15d, the fifth signal wire 15e, and the sixth signal wire 15f are arranged in this order from one widthwise side toward the other widthwise side.

At the mounting portion 3, the first signal wire 15a, the second signal wire 15b, and the third signal wire 15c (one-side signal wires 15g) are formed and disposed to extend over and along the outrigger portion 8 on one widthwise side. On the other hand, the fourth signal wire 15d, the fifth signal wire 15e, and the sixth signal wire 15f (other-side signal wires 15h) are disposed to extend over and along the outrigger portion 8 on the other widthwise side.

The first signal wire 15a, the second signal wire 15b, the third signal wire 15c, the fourth signal wire 15d, the fifth signal wire 15e, and the sixth signal wire 15f are disposed to turn back at the wire turn-back portion 6, and reach the head-side-terminal formation portion 45. Specifically, the individual signal wires 15 are disposed to extend along the outrigger portions 8 till reaching the front end portions thereof on both widthwise outsides of the wire turn-back portion 6, where they bend to extend in the widthwise inward direction at the wire turn-back portion 6. Thereafter, the signal wires 15 further turn back toward the rear side to extend from the rear end of the wire turn-back portion 6 toward the rear side, and reach the front end portions of the head-side terminals 16 of the head-side-terminal formation portion 45.

Of the signal wires 15, the outermost first signal wire 15a and the outermost sixth signal wire 15f are formed apart from the outer end edges of the metal supporting board 11 with spaces where the power source wires 21 described later are formed being interposed therebetween.

The plurality of (six) external terminals 17 are provided to be disposed on the surface of the rear end portion of the wiring portion 2, and connected to the respective rear end portions of the individual signal wires 15. The external terminals 17 are arranged to be spaced apart from each other in the widthwise direction. The external terminals 17 are formed of a first external terminal 17a, a second external terminal 17b, a third external terminal 17c, a fourth external terminal 17d, a fifth external terminal 17e, and a sixth external terminal 17f which are connected correspondingly to the first signal wire 15a, the second signal wire 15b, the third signal wire 15c, the fourth signal wire 15d, the fifth signal wire 15e, and the sixth signal wire 15f, and arranged in this order from one widthwise side toward the other widthwise side.

The external terminals 17 are electrically connected to an external circuit board 35 as an external circuit, as indicated by the imaginary line of FIG. 6. Examples of the external circuit board 35 that may be used include a read/write board.

The head-side terminals 16 are disposed on the surface of the mounting portion 3. More specifically, the head-side terminals 16 are disposed at the head-side-terminal formation portion 45 of the gimbal portion 5. The plurality of (six) head-side terminals 16 are provided so as to be connected to the respective front end portions of the individual signal wires 15.

More specifically, the head-side terminals 16 are arranged along the rear end edge (front end edge of the slider mounting region 43) of the head-side-terminal formation portion 45 to be spaced apart from each other in the widthwise direction.

The plurality of head-side terminals 16 are formed of a first head-side terminal 16a, a second head-side terminal 16b, a third head-side terminal 16c, a fourth head-side terminal 16d, a fifth head-side terminal 16e, and a sixth head-side terminal 16f. The head-side terminals 16 are connected correspondingly to the third signal wire 15c, the second signal wire 15b, and the first signal wire 15a (the one-side signal wires 15g) and to the sixth signal wire 15f, the fifth signal wire 15e, and the fourth signal wire 15d (the other-side signal wires 15h). The third head-side terminal 16c, the second head-side terminal 16b, and the first head-side terminal 16a (one-side head-side terminals 16g), and the sixth head-side terminal 16f, the fifth head-side terminal 16e, and the fourth head-side terminal 16d (other-side head-side terminals 16h) are arranged in this order from one widthwise side toward the other widthwise side.

Each of the head-side terminals 16 is electrically connected to the magnetic head 38 (indicated by the imaginary line of FIG. 6) via a solder ball 41 (indicated by the imaginary line of FIG. 6).

In the first conductive pattern 13, a write signal transmitted from the external circuit board 35 is inputted to the magnetic head 38 of the slider 39 via the external terminals 17, the signal wires 15, and the head-side terminals 16, while a read signal read with the magnetic head 38 is inputted to the external circuit board 35 via the head-side terminals 16, the signal wires 15, and the external terminals 17.

The second conductive pattern 19 is formed on the surface of the metal supporting board 11, and includes supply-side terminals 23 each as a third terminal, element-side terminals 22 each as a fourth terminal, and the power source wires 21 for connecting the supply-side terminals 23 and the element-side terminals 22.

The plurality of (four) power source wires 21 are provided along the longitudinal direction to extend over the board main body portion 20 and the auxiliary portion 30, and arranged in parallel to be spaced apart from each other in the widthwise direction.

The plurality of power source wires 21 are formed of a first power source wire 21a, a second power source wire 21b, a third power source wire 21c, and a fourth power source wire 21d. The first power source wire 21a, the second power source wire 21b, the third power source wire 21c, and the fourth power source wire 21d are arranged in this order from one widthwise side toward the other widthwise side.

In the board main body portion 20, one-side power source wires 21e (the first power source wire 21a and the second power source wire 21b) disposed on one widthwise side and other-side power source wires 21f (the third power source wire 21c and the fourth power source wire 21d) disposed on the other widthwise side are arranged apart from each other with a space where the signal wires 15 are formed being widthwise interposed therebetween.

That is, at the wiring portion 2 of the board main body portion 20, the first power source wire 21a and the second power-source wire 21b are disposed on one widthwise side (outside) of the first signal wire 15a, and the first power source wire 21a is disposed on one widthwise side of the second power source wire 21b. Additionally, at the wiring portion 2 of the board main body portion 20, the third power source wire 21c and the fourth power source wire 21d are disposed on the other widthwise side (outside) of the sixth signal wire 15f, and the fourth power source wire 21d is disposed on the other widthwise side of the third power source wire 21c.

More specifically, the first power source wire 21a and the second power source wire 21b are disposed on one widthwise side of the first signal wire 15a in spaced-apart relation at the outrigger portion 8, and disposed on the front side of the first signal wire 15a in spaced-apart relation at the wire turn-back portion 6.

On the other hand, the third power source wire 21c and the fourth power source wire 21d are disposed on the other widthwise side of the sixth signal wire 15f in spaced-apart relation at the outrigger portion 8, and disposed on the front side of the sixth signal wire 15f in spaced-apart relation at the wire turn-back portion 6.

Additionally, the first power source wire 21a and the second power source wire 21b are disposed to extend along the first signal wire 15a at the outrigger portion 8 till reaching the wire turn-back portion 6, where they bend and extend toward the other widthwise side (inwardly). After bending toward the front side at the widthwise center of the wire turn-back portion 6, the first power source wire 21a and the second power source wire 21b successively pass through the protruding portion 27 and the fold portion 18 to reach the element-side-terminal formation portion 46 of the auxiliary portion 30.

The third power source wire 21c and the fourth power source wire 21d are disposed to extend along the sixth signal wire 15f at the outrigger portion 8 till reaching the wire turn-back portion 6, where they bend and extend toward one widthwise side (inwardly). After bending toward the front side at the widthwise center of the wire turn-back portion 6, the third power source wire 21c and the fourth power source wire 21d successively pass through the protruding portion 27 and the fold portion 18 to reach the element-side-terminal formation portion 46 of the auxiliary portion 30.

The plurality of (four) supply-side terminals 23 are provided to be disposed on the surface of the rear end portion of the wiring portion 2, and connected to the respective rear end portions of the individual power source wires 21. The supply-side terminals 23 are formed of a first supply-side terminal 23a, a second supply-side terminal 23b, a third supply-side terminal 23c, and a fourth supply-side terminal 23d connected correspondingly to the first power source wire 21a, the second power source wire 21b, the third power source wire 21c, and the fourth power source wire 21d. The first supply-side terminal 23a, the second supply-side terminal 23b, the third supply-side terminal 23c, and the fourth supply-side terminal 23d are arranged in this order from one widthwise side toward the other widthwise side.

One-side supply-side terminals 23e (the first supply-side terminal 23a and the second supply-side terminal 23b) disposed on one widthwise side and other-side supply-side terminals 23f (the third supply-side terminal 23c and the fourth supply-side terminal 23d) disposed on the other widthwise side are disposed apart from each other with a space where the external terminals 17 are formed being widthwise interposed therebetween.

Additionally, the supply-side terminals 23 are formed to be disposed at the same positions as those of the external terminals 17 when projected in the widthwise direction. The supply-side terminals 23 are electrically connected to a power source (not shown) as the external circuit.

The element-side terminals 22 are disposed on the surface of the auxiliary portion 30 and, more specifically, disposed on the element-side-terminal formation portion 46. The plurality of (four) element-side terminals 22 are provided so as to be connected to the respective front end portions of the individual power source wires 21.

The element-side terminals 22 are arranged along the front end edge (the rear end edge of the element mounting region 44) of the element-side-terminal formation portion 46 to be spaced apart from each other in the widthwise direction. The element-side terminals 22 are formed of a first element-side terminal 22a, a second element-side terminal 22b, a third element-side terminal 22c, and a fourth element-side terminal 22d which are connected correspondingly and respectively to the first power source wire 21a, the second power source wire 21b, the third power source wire 21c, and the fourth power source wire 21d. The first element-side terminal 22a, the second element-side terminal 22b, the third element-side terminal 22c, and the fourth element-side terminal 22d are arranged in this order from one widthwise side toward the other widthwise side.

That is, the first element-side terminal 22a and the second element-side terminal 22b (one-side element-side terminals 22e) are disposed on one widthwise side, and the third element-side terminal 22c and the fourth element-side terminal 22d (other-side element-side terminals 22f) are disposed on the other widthwise wide.

The element-side terminals 22 are arranged to face the head-side terminals 16 in the longitudinal direction. Note that, as shown in FIG. 6, the element-side terminals 22 are arranged to face the head-side terminals 16 in the thickness direction when the auxiliary portion 30 is folded back.

As indicated by the imaginary line of FIG. 6, the electronic element 40 is electrically connected to each of the element-side terminals 22 via the solder ball 41.

In the second conductive pattern 19, electric energy supplied from the power source is supplied to the electronic element 40 via the supply-side terminals 23, the power source wires 21, and the element-side terminals 22 to drive the electronic element 40.

As shown in FIG. 2, the suspension board with circuit 1 includes the metal supporting board 11, the insulating base layer 12 formed on the surface of the metal supporting board 11, the conductive pattern 7 formed on the surface of the insulating base layer 12, and the insulating cover layer 14 formed on the surface of the insulating base layer 12 so as to cover the conductive pattern 7.

The metal supporting board 11 is formed of a metal material such as, e.g., stainless steel, a 42-alloy, aluminum, a copper-beryllium alloy, or phosphor bronze. Preferably, the metal supporting board 11 is formed of stainless steel. The thickness of the metal supporting board 11 is in a range of, e.g., 15 to 50 μm, or preferably 20 to 30 μm.

The insulating base layer 12 is formed to correspond to a portion where the conductive pattern 7 is to be formed.

Examples of an insulating material for forming the insulating base layer 12 include synthetic resins such as a polyimide resin, a polyamideimide resin, an acrylic resin, a polyether nitrile resin, a polyether sulfone resin, a polyethylene terephthalate resin, a polyethylene naphthalate resin, and a polyvinyl chloride resin. Preferably, the insulating base layer 12 is formed of a polyimide resin.

The thickness of the insulating base layer 12 is in a range of, e.g., 1 to 35 μm, or preferably 8 to 15 μm.

Examples of a conductive material for forming the conductive pattern 7 include copper, nickel, gold, a solder, or an alloy thereof. Preferably, the conductive pattern 7 is formed of copper.

The thickness of the conductive pattern 7 is in a range of, e.g., 3 to 50 μm, or preferably 5 to 20 μm.

The widths of each of the signal wires 15 and each of the power source wires 21 are in a range of, e.g., 10 to 200 μm, or preferably 20 to 100 μm. The spacing between the individual signal wires 15, the spacing between the individual power source wires 21, and the spacings between the signal wires 15 and the power source wires 21 (the spacing between the first signal wire 15a and the second power source wire 21b, and the spacing between the sixth signal wire 15f and the third power source wire 21c) are in a range of, e.g., 10 to 1000 μm, or preferably 20 to 100 μm.

The widths of each of the external terminals 17, each of the head-side terminals 16, each of the supply-side terminals 23, and each of the element-side terminals 22 are in a range of, e.g., 20 to 1000 μm, or preferably 30 to 800 μm. The spacing between the individual external terminals 17, the spacing between the individual head-side terminals 16, the spacing between the individual supply-side terminals 23, the spacing between the individual element-side terminals 22, and the spacings between the external terminals 17 and the supply-side terminals 23 (the spacing between the first external terminal 17a and the second supply-side terminal 23b, and the spacing between the sixth external terminal 17f and the third supply-side terminal 23c) are in a range of, e.g., 20 to 1000 μm, or preferably 30 to 800 μm.

The insulating cover layer 14 is disposed to correspond to the portion where the conductive pattern 7 is to be formed. Specifically, the insulating cover layer 14 is formed in a pattern which exposes the external terminals 17 and the head-side terminals 16, and covers the signal wires 15 correspondingly to the first conductive pattern 13. The insulating cover layer 14 is also formed in the pattern which exposes the supply-side terminals 23 (not shown in FIG. 2) and the element-side terminals 22, and covers the power source wires 21 correspondingly to the second conductive pattern 19.

The insulating cover layer 14 is formed of the same insulating material as the insulating material of the insulating base layer 12 mentioned above. The thickness of the insulating cover layer 14 is in a range of, e.g., 1 to 40 μm, or preferably 1 to 10 μm.

Next, a producing method of the suspension board with circuit 1 is described with reference to FIG. 3.

In the method, as shown in FIG. 3(a), the metal supporting board 11 is prepared first.

Next, as shown in FIG. 3(b), a varnish of a photosensitive insulating material is coated on the surface of the metal supporting board 11, dried, exposed to light, developed, and then cured by heating to form the insulating base layer 12 in the foregoing pattern.

Next, as shown in FIG. 3(c), the conductive pattern 7 is formed on the surface of the insulating base layer 12 by an additive method, a subtractive method, or the like.

Next, as shown in FIG. 3(d), a varnish of a photosensitive insulating material is coated on the surface of the insulating base layer 12 so as to cover the conductive pattern 7, dried, exposed to light, developed, and then cured by heating to form the insulating cover layer 14 in the foregoing pattern.

Next, as shown in FIG. 3(e), the slit portion 4 and the opening 25 are formed in the metal supporting board 11. The slit portion 4 and the opening 25 are formed by, e.g., an etching method such as dry etching (e.g., plasma etching) or wet etching (e.g., chemical etching), drilling perforation, laser processing, or the like. Preferably, the slit portion 4 and the opening 25 are formed by wet etching.

Simultaneously with the formation thereof, the metal supporting board 11 is trimmed, whereby the suspension board with circuit 1 integrally including the board main body portion 20 and the auxiliary portion 30 (including the insertion portion 26) is obtained. Note that, in the trimming of the metal supporting board 11, the notched portions 28 and the insertion portion 26 are formed.

Thereafter, as shown in FIGS. 4 to 6, the auxiliary portion 30 of the suspension board with circuit 1 is folded back with respect to the board main body portion 20 so as to face the back surface of the board main body portion 20 (folding-back step).

Specifically, the auxiliary portion 30 is folded back with respect to the board main body portion 20 such that the back surface of the metal supporting board 11 of the auxiliary portion 30, and the back surface of the metal supporting board 11 of the board main body portion 20 are arranged adjacent to each other in the thickness direction.

In the folding-back step, the auxiliary portion 30 is folded back such that the surface (back surface) of the fold portion 18 forms a mountain (valley) portion.

In the folding-back step, the insertion portion 26 of the auxiliary portion 30 folded back is upwardly inserted into the opening 25 of the board main body portion 20.

Next, the portions of the metal supporting board 11 adjacent to each other in the thickness direction (the metal supporting board 11 of the mounting portion 3, and the metal supporting board 11 of the auxiliary portion 30) are jointed together (joining step) by a joining method such as, e.g., welding. For the welding, spot welting, e.g., is used. Specifically, spot welding described in any one of Japanese Unexamined Patent Nos. 2004-154836, 2003-173643, 2005-071465, and 2006-059464 is used.

Thereafter, in the board main body portion 20, the slider 39 having the magnetic head 38 mounted thereon is mounted on the slider mounting region 43 via an adhesive 42. Subsequently, the magnetic head 38 is electrically connected to the head-side terminals 16 via the solder balls 41. In addition, the external circuit board 35 is electrically connected to the external terminals 17.

In the auxiliary portion 30, the electronic element 40 is mounted on the element mounting region 44 via the adhesive 42. Subsequently, the electronic element 40 is electrically connected to the element-side terminals 22 via the solder balls 41. In addition, in the board main body portion 20, the electric source (not shown) is electrically connected to the supply-side terminals 23.

Thereafter, in the hard disk drive, the wiring portion 2 is mounted with the back surface thereof facing downward on the surface of the load beam so as to be supported thereby.

In the suspension board with circuit 1, each of the external terminals 17, the head-side terminals 16, and the supply-side terminals 23 are disposed on the board main body portion 20, while the element-side terminals 22 are disposed on the auxiliary portion 30.

That is, the element-side terminals 22 are disposed on the auxiliary portion 30 different from the board main body portion 20 on which the external terminals 17, the head-side terminals 16, and the supply-side terminals 23 are disposed.

This allows formation of the external terminals 17, the head-side terminals 16, and the supply-side terminals 23, each described above, at different low arrangement densities on the board main body portion 20, while allowing separate formation of the element-side terminals 22 described above at another different low arrangement density on the auxiliary portion 30. As a result, it is possible to prevent the short circuit between the above-mentioned terminals, and consequently achieve an improvement in the connection reliability of the conductive pattern 7.

Besides, by folding back the auxiliary portion 30 such that it faces the back surface of the board main body portion 20, it is possible to mount the electronic element 40 on the auxiliary portion 30 facing the back surface of the board main body portion 20, while allowing the magnetic head 38 to be mounted on the surface of the board main body portion 20. This can achieve compactization of the suspension board with circuit 1.

In addition, the electronic element 40 can be disposed to face the magnetic head 38 in the thickness direction, and can also be disposed in the vicinity of the magnetic head.

Further, in accordance with the method described above, it is possible to reliably maintain the folded-back state of the auxiliary portion 30 by a simple and easy method of folding back the auxiliary portion 30, and then joining together the auxiliary portion 30 and the board main body portion 20 by welding.

In the description given above, the supply-side terminals 23 are provided on the board main body portion 20. However, it is also possible to, e.g., provide the supply-side terminals 23 on the auxiliary portion 30, though not shown.

In that case, the power source wires 21 are disposed on the auxiliary portion 30.

In such a suspension board with circuit 1, both of the external terminals 17 and the head-side terminals 16 are disposed on the board main body portion 20, while both of the supply-side terminals 23 and the element-side terminals 22 are disposed on the auxiliary portion 30.

That is, the supply-side terminals 23 and the element-side terminals 22 are disposed on the auxiliary portion 30 different from the board main body portion 20 on which the external terminals 17 and the head-side terminals 16 are disposed.

This allows formation of the external terminals 17 and the head-side terminals 16 at different low arrangement densities on the board main body portion 20, while allowing separate formation of the supply-side terminals 23 and the element-side terminals 22 at other different low arrangement densities on the auxiliary portion 30. As a result, it is possible to prevent the short circuit between the above-mentioned terminals, and consequently achieve an improvement in the connection reliability of the conductive pattern 7.

In the description given above, after the folding-back step and the joining step, the slider 39 and the electronic element 40 are mounted on the suspension board with circuit 1 that has been subjected to the folding-back step and the joining step.

However, the order of the individual steps is not limited thereto. For example, it is also possible to first mount the slider 39 and the electronic element 40 on the suspension board with circuit 1 that has not been subjected to the folding-back step and the joining step yet, and then subject the suspension board with circuit 1 having the slider 39 and the electronic element 40 mounted thereon to the folding-up step and the joining step.

In the description given above, it is possible to use, e.g., a microactuator as the electronic element 40. As shown in FIG. 6, when the electronic element 40 is an actuator, the microactuator 40 is disposed to face the slider 39 in the thickness direction when the auxiliary portion 30 is folded back. This allows more accurate and finer adjustment of the position and angle of the magnetic head 38 using the microactuator 40.

Figure 7:
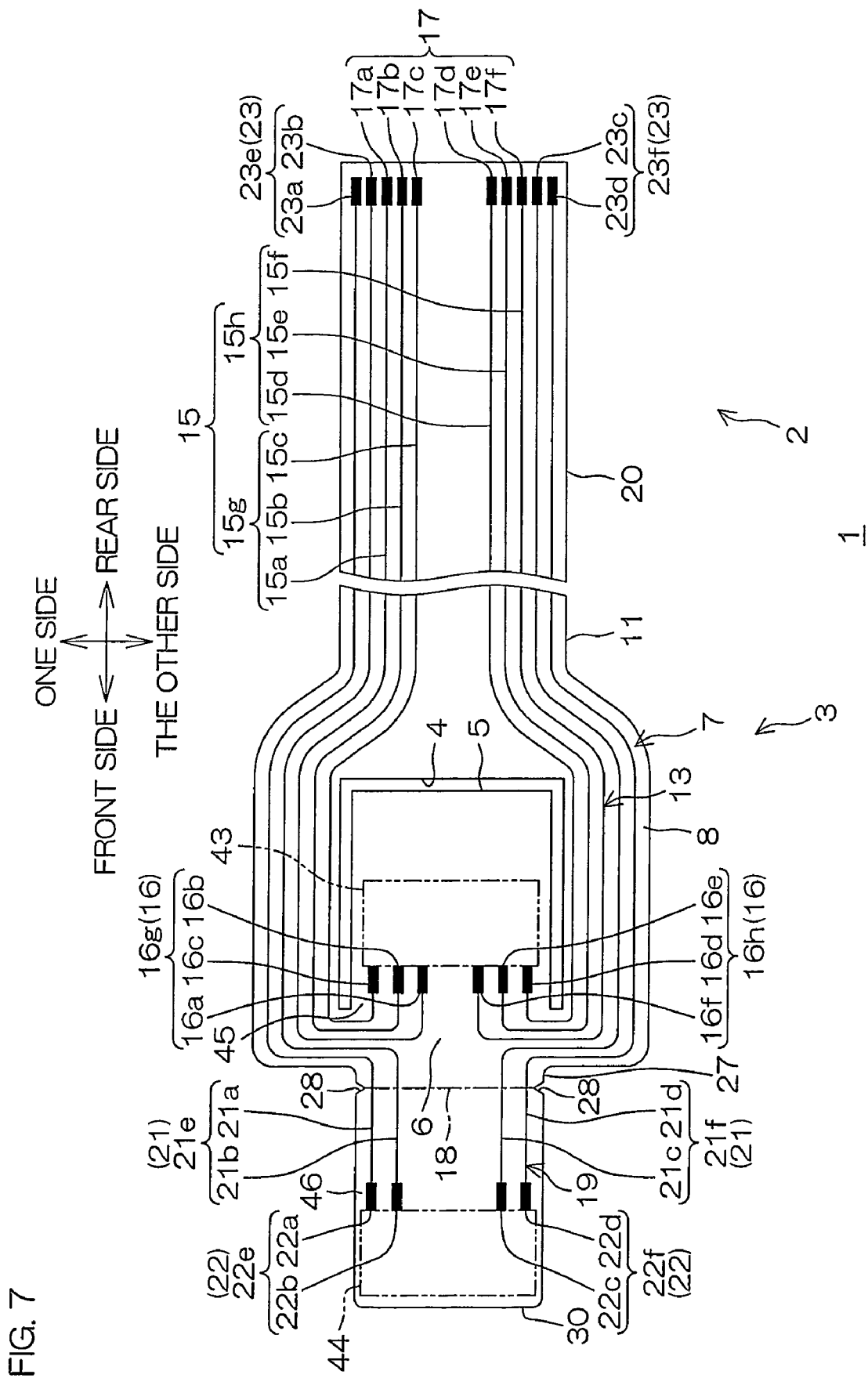
FIG. 7 is a plan view of a suspension board with circuit according to another embodiment of the present invention.
Figure 8:
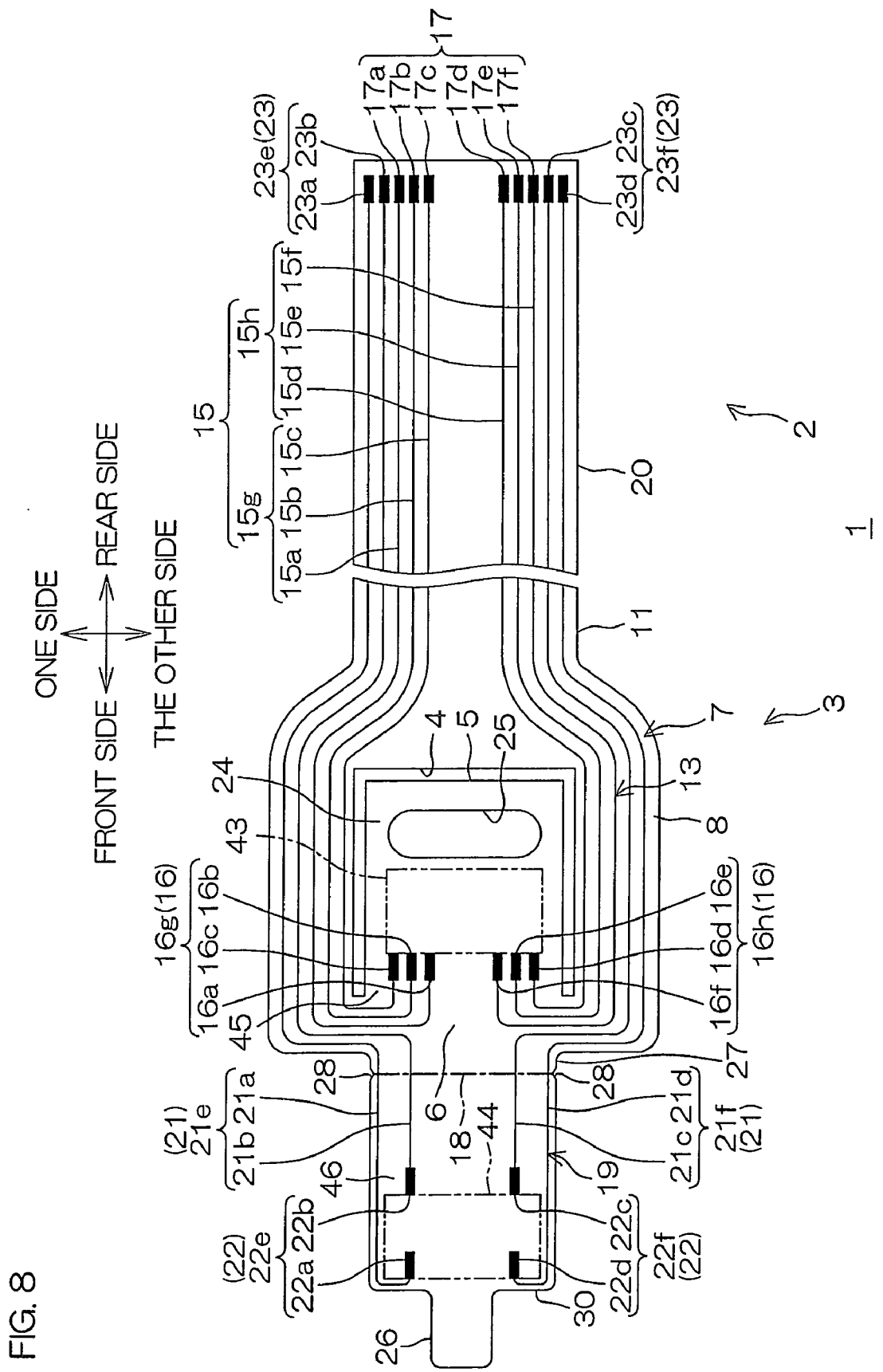
FIG. 8 is a plan view of a suspension board with circuit according to still another embodiment of the present invention.

FIGS. 7 and 8 are plan views of another embodiment and still another embodiment of the suspension board with circuit of the present invention. The members corresponding to the individual members described above are designated by the same reference numerals in each of the drawings referenced hereinafter, and a detailed description thereof is omitted.

In the description given above, the insertion portion 26 and the opening 25 are formed. However, as shown in FIG. 7, it is also possible to, e.g., fold back the auxiliary portion 30 without forming the insertion portion 26 and the opening 25.

Preferably, the insertion portion 26 and the opening 25 are formed as shown in FIG. 1, the insertion portion 26 is inserted into the opening 25 as shown in FIGS. 4 to 6, and the auxiliary portion 30 is folded back.

By forming the insertion portion 26 and the opening 25 as shown in FIG. 1, and inserting the insertion portion 26 into the opening 25 as shown in FIGS. 4 to 6, it is possible to stabilize the folded-back state of the auxiliary portion 30 after the folding-back step. This allows the auxiliary portion 30 and the board main body portion 20 to be reliably joined together in the joining step after the folding-back step.

In the description given above, the element-side terminals 22 are formed on the element-side-terminal formation portion 46. However, as shown in FIG. 8, it is also possible to, e.g., further form the element-side terminals 22 not only on the element-side-terminal formation portion 46 but also on the element mounting region 44.

In FIG. 8, the element-side terminals 22 are alignedly arranged to be spaced apart from each other in the both widthwise and longitudinal directions. The first element-side terminal 22a and the fourth element-side terminal 22d are disposed on the element mounting region 44. Specifically, the first element-side terminal 22a and the fourth element-side terminal 22d are arranged along the front end edge of the element mounting region 44 to be spaced apart from each other.

The first element-side terminal 22a is disposed on the front side of the second element-side terminal 22b to face the second element-side terminal 22b in spaced-apart relation. The fourth element-side terminal 22d is disposed on the front side of the third element-side terminal 22c to face the third element-side terminal 22c in spaced-apart relation.

In the auxiliary portion 30, the first power source wire 21a is disposed on one widthwise side of the element mounting region 44 to pass it around toward the front side, and has the front end portion thereof connected to the front end portion of the first element-side terminal 22a. On the other hand, in the auxiliary portion 30, the fourth power source wire 21d is disposed on the other widthwise side of the auxiliary portion 30 to pass it around toward the front side, and has the front end portion thereof connected to the front end portion of the second element-side terminal 22b.

Figure 9:
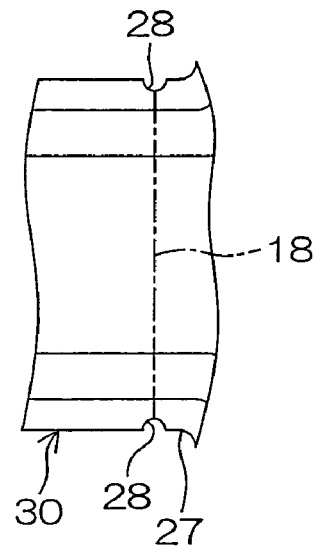
FIG. 9 is an enlarged plan view of a fold portion of a suspension board with circuit according to yet another embodiment of the present invention.
Figure 10:
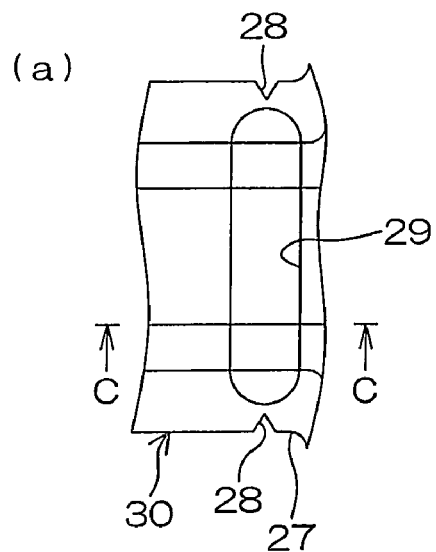
FIG. 10 is an enlarged view of the fold portion of a suspension board with circuit according to still another embodiment of the present invention,
 (a) showing a plan view thereof, and
 (b) showing a cross-sectional view thereof along the line C-C of (a).
Figure 10:
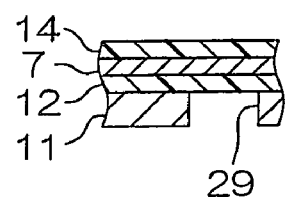

FIG. 9 is an enlarged plan view of the fold portion of a suspension board with circuit according to yet another embodiment of the present invention. FIG. 10 is an enlarged view of the fold portion of a suspension board with circuit according to yet another embodiment of the present invention, (a) showing a plan view thereof, and (b) showing a cross-sectional view thereof along the line C-C of (a).

In the description given above, each of the notched portions 28 is formed in a generally triangular plan view shape. However, the shape of the notched portion 28 is not limited thereto. For example, as shown in FIG. 9, the notched portion 28 can also be formed into an arbitrary shape such as a generally semicircular plan view shape.

In the description given above, the power source wires 21 at the fold portion 18 are supported by the metal supporting board 11. However, as shown in FIG. 10, the power source wires 21 can also be allowed to pass through the fold portion 18 so as not to be supported by the metal supporting board 11.

The fold portion 18 has a folded-back opening 29 formed to extend through the metal supporting board in the thickness direction.

The folded-back opening 29 is formed in a long hole shape elongated in the widthwise direction when viewed in plan view. The folded-back opening 29 is formed midway in the widthwise direction. Specifically, the folded-back opening 29 is formed between the two notched portions 28 to be spaced apart therefrom in the widthwise direction. The folded-back opening 29 is also formed to expose the plurality of power source wires 21.

The power source wires 21 exposed from the folded-back opening 29 are supported by the insulating base layer 12 from therebelow, and supported by the insulating cover layer 14 from thereabove.

By forming the folded-back opening 29, the fold portion 18 can be formed as a fragile portion having a further reduced mechanical strength. Accordingly, the folding-up step can be performed more easily.

Furthermore, the power source wires 21 are supported by the insulating base layer 12 and the insulating cover layer 14 each made of a relatively flexible insulating material (synthetic resin) or the like without being supported by the folded-back opening 29. Therefore, in the folding-back step, the power source wires 21 exposed from the folded-back opening 29 can gently curve by flexibly following the folding of the fold portion 18. As a result, it is possible to effectively prevent breakage of the power source wires 21 resulting from the folding of the fold portion 18.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A suspension board with circuit comprising:
a conductive pattern;
a board main body portion having a surface on which a magnetic head is mounted; and
an auxiliary portion formed continuously from the board main body portion, and capable of being folded back with respect to the board main body portion so as to face a back surface of the board main body portion, wherein the conductive pattern includes:
a first conductive pattern including a first terminal electrically connected to an external circuit, and a second terminal electrically connected to the magnetic head; and a second conductive pattern including a third terminal electrically connected to the external circuit, and a fourth terminal electrically connected to an electronic element, wherein, in the first conductive pattern, both of the first terminal and the second terminal are disposed on the board main body portion, and, in the second conductive pattern, the third terminal is disposed on the board main body portion or on the auxiliary portion, and the fourth terminal is disposed on the auxiliary portion.

2. The suspension board with circuit according to claim 1, wherein the board main body portion has an opening formed to extend therethrough in a thickness direction, and the auxiliary portion includes an insertion portion to be inserted into the opening when the auxiliary portion is folded back.

3. The suspension board with circuit according to claim 1, wherein the board main body portion includes a slider mounting region where a slider for mounting thereon the magnetic head is mounted, the auxiliary portion includes an element mounting region where the electronic element is mounted, and the slider mounting region and the element mounting region are disposed to face each other in a thickness direction when the auxiliary portion is folded back.

4. A producing method of a suspension board with circuit comprising:

a conductive pattern;

a board main body portion having a surface on which a magnetic head is mounted; and an auxiliary portion formed continuously from the board main body portion, and capable of being folded back with respect to the board main body portion so as to face a back surface of the board main body portion, wherein the conductive pattern includes:

a first conductive pattern including a first terminal electrically connected to an external circuit, and a second terminal electrically connected to the magnetic head; and a second conductive pattern including a third terminal electrically connected to the external circuit, and a fourth terminal electrically connected to an electronic element, wherein, in the first conductive pattern, both of the first terminal and the second terminal are disposed on the board main body portion, and, in the second conductive pattern, the third terminal is disposed on the board main body portion or on the auxiliary portion, and the fourth terminal is disposed on the auxiliary portion, the producing method of the suspension board with circuit comprising:

a folding-back step of folding back the auxiliary portion of the suspension board with circuit with respect to the board main body portion such that the auxiliary portion faces the back surface of the board main body portion; and a step of, after the folding-back step, joining together the metal supporting board of the board main body portion and the metal supporting board of the auxiliary portion which are adjacent to each other in a thickness direction by welding.

\* \* \* \* \*